United States Patent [19]
Allan et al.

[11] Patent Number: 5,761,148
[45] Date of Patent: Jun. 2, 1998

[54] SUB-WORD LINE DRIVER CIRCUIT FOR MEMORY BLOCKS OF A SEMICONDUCTOR MEMORY DEVICE

[75] Inventors: James D. Allan, Colorado Springs; Robert W. G. Manning, Monument, both of Colo.

[73] Assignee: Cypress Semiconductor Corp., San Jose, Calif.

[21] Appl. No.: 766,090

[22] Filed: Dec. 16, 1996

[51] Int. Cl.⁶ ............................................. G11C 8/00
[52] U.S. Cl. ......................... 365/230.06; 365/230.03; 365/190; 365/51; 365/63
[58] Field of Search ................... 365/230.06, 230.03, 365/190, 51, 63

[56] References Cited

U.S. PATENT DOCUMENTS

| | | | |
|---|---|---|---|
| 5,193,074 | 3/1993 | Anami | 365/230.03 |
| 5,416,748 | 5/1995 | Fujita | 365/230.06 |
| 5,461,593 | 10/1995 | Kim | 365/230.06 |

OTHER PUBLICATIONS

"Session XIII: Static RAMs, THPM 13.3: A 25ns Full-CMOS 1Mb SRAM", *IEEE International Solid-State Circuits Conference*, pp. 178-179, Feb. 18, 1988.

"Session 8: Static RAMs, TPM 8.1: A 15NS 4MB CMOS SRAM", *IEEE International Solid-State Circuits Conference*, pp.126-127 & p. 280, Feb. 15, 1990.

*Primary Examiner*—David C. Nelms
*Assistant Examiner*—Andrew Q. Tran
*Attorney, Agent, or Firm*—Blakely, Sokoloff, Taylor & Zafman LLP

[57] ABSTRACT

A block selecting scheme for a memory device. The block selecting scheme includes a sub word line driver circuit having multiple sub word line drivers and an inverter circuit. For one embodiment, the sub word line driver circuit includes four sub word line drivers. Each sub word line driver is used to select the sub word line for a corresponding memory block. Each of the sub word line drivers is coupled to a global word line via the inverter circuit. Furthermore, each of the sub word line drivers operates as an inverter. By coupling the global word line and each of the sub word lines via two inversion circuits, the global word line and the sub word lines are typically at the same voltage level. Thus, the deleterious effect of shorting between adjacent global word lines and sub word lines is substantially reduced. Furthermore, by grouping more than two sub word line drivers together, the overall die size of the memory device may be reduced.

19 Claims, 11 Drawing Sheets

| ROW DECODER | 650 |
|---|---|
| BLOCK 615 | BLOCK 631 |
| BLOCK 614 | BLOCK 630 |
| 614a | 630a |
| 615a | 631a |
| 612a | 628a |
| 613a | 629a |
| BLOCK 613 | BLOCK 629 |
| BLOCK 612 | BLOCK 628 |
| BLOCK 611 | BLOCK 627 |
| BLOCK 610 | BLOCK 626 |
| 610a | 626a |
| 611a | 627a |
| 608a | 624a |
| 609a | 625a |
| BLOCK 609 | BLOCK 625 |
| BLOCK 608 | BLOCK 624 |
| BLOCK 607 | BLOCK 623 |
| BLOCK 606 | BLOCK 622 |
| 606a | 622a |
| 607a | 623 a |
| 604a | 620a |
| 605a | 621a |
| BLOCK 605 | BLOCK 621 |
| BLOCK 604 | BLOCK 620 |
| BLOCK 603 | BLOCK 619 |
| BLOCK 602 | BLOCK 618 |
| 602a | 618a |
| 603a | 619a |
| 600a | 616a |
| 601a | 617a |
| BLOCK 601 | BLOCK 617 |
| BLOCK 600 | BLOCK 616 |

(Center: COLUMN DECODER 640)

SUB-WORD LINE DRIVER CIRCUIT FOR MEMORY BLOCKS OF A SEMICONDUCTOR MEMORY DEVICE

FIELD OF THE INVENTION

The present invention relates generally to the field of integrated circuits. More particularly, the present invention relates to the field of memory integrated circuits.

BACKGROUND OF THE INVENTION

Various volatile and non-volatile memory devices include an array of memory cells divided into memory blocks. For example, FIG. 1 illustrates a memory architecture 100 having its memory array divided into 32 blocks of memory cells. Each block 0–31 in the memory device 100 may include multiple memory cells arranged in a miniature array ("mini-array") having 128 columns and 260 rows. In order to access a particular memory cell or location in the memory array, three types of addresses are typically required—the column address, the row address, and the block address.

The column addresses are typically applied to the column decoder 40 of the memory device 100 to generate the column select signals. Likewise, the row addresses are typically applied to the row decoder 50 of the memory device 100 to produce the selected row lines or global word lines ("GWLs"). The global word lines usually run the entire length of the memory device 100. Typically, at the edge of each memory block is a sub word line ("SWL") driver circuit. The SWL driver circuits 0a–31a are used for selecting the sub word lines for the memory blocks 0–31. Each global word line may be coupled to multiple sub word lines and each sub word line may be coupled to multiple memory cells.

Each sub word line driver circuit may be coupled to a global word line and a pair of block select signals, as shown in FIG. 2. A sub word line driver circuit may select or deselect its sub word line in response to the selection or deselection of its corresponding global word line and its corresponding pair of block select signals. FIG. 2 illustrates a conventional block selecting scheme for two memory blocks. According to FIG. 2, the row decoder 200 is coupled to the global word line 200a. The global word line 200a is coupled to the sub word line driver 220, which is coupled to the memory block 210 via the sub word line 220a. The global word line 200a is also coupled to the sub word line driver 230, which is coupled to the memory block 240 via sub word line 230a. The sub word line driver 220 receives the block select ("BS") signals 220b and 220c, and the sub word line driver 230 receives the block select signals 230b and 230c. The block select signal 220c represents the complement of the block select signal 220b (i.e., a block select signal "bar"), and block select signal 230c represents the block select signal 230b bar.

Thus, when the global word line 200a and the block select signals 220b and 220c are asserted (i.e., selected), then the sub word line driver 220 selects the sub word line 220a. The sub word line 220a is used for selecting the memory block 210. Similarly, the global word line 220a and the block select signals 230b and 230c are used by the sub word line driver 230 to select the memory block 240 via the sub word line 230a.

Often, the global word lines are at a logic low voltage level when selected and the sub word lines are at a logic high voltage level when selected. On the other hand, when these lines are deselected, the global word lines may be at a logic high voltage level and the sub word lines may be at a logic low voltage level. When addressing a particular row in the memory array, typically only one global word line is selected and only one sub word line in a group of sub word lines corresponding to the selected global word line is selected.

A common failure mode in memory devices occurs during the low power (i.e., standby) mode of operation when the standby current generated by the memory device exceeds the maximum standby current specified by the manufacturer of that particular device. During the low power mode of operation, the global word lines and the sub word lines are usually deselected. However, in many schemes, a deselected global word line has a "high" voltage potential and a deselected sub word line has a "low" voltage potential. Furthermore, in certain memory devices, the global word lines and the sub word lines are laid out on the die adjacent to one another. Thus, if the two lines short during the low power mode of operation, the deselected sub word line acts as a low-resistance current conduit from the high voltage global word line to ground. Consequently, the standby current may exceed its specified functional value and cause the memory device to fail. This type of failure is typically not repairable and may cause yield loss for a particular memory device. Unfortunately, this type of failure may even occur when a defective row is replaced by a redundant row (i.e., fuse replaced) and the defective row is never accessed. Thus, it is desirable to eliminate or reduce this type of failure in a memory device.

FIG. 3 illustrates a conventional memory cell 300 having its global word line located adjacent to its sub word line. According to FIG. 3, the global word line 310 may be fabricated from a metal layer, referred to as metal 2. The sub word line 320 may be fabricated from the metal 2 layer and a polysilicon layer, referred to as poly 1. The metal 2 and poly 1 layers are electrically connected together (e.g., using a conventional via or contact) to form the sub word line 320. The bit select line 340 and the bit select line bar 330 may be fabricated from a metal layer referred to as metal 1. FIG. 3 illustrates that the global word line 310 and the sub word line 320 are located adjacent to one another.

As noted above, the row decoders are used to select the global word lines and the sub word line driver circuits are used to select the sub word lines. FIG. 4 illustrates a conventional row decoding circuit 400 which includes a row decoder 410, sub word line drivers 420a and 420b, global word line 430, and sub word lines 440 and 450. In row decoding circuit 400, global word line 430 and sub word lines 440 and 450 typically have complementary logic levels. Furthermore, row decoding circuitry 400 includes only two sub word line driver circuits 420a and 420b.

According to FIG. 4, the row decoder 410 includes three inversion devices (i.e., the nand gate 411, the inverter 412, and the inverter 415), the fuse device 414, and the n-channel metal oxide semiconductor ("MOS") transistor 413. The row address inputs 411a–c receive row address signals. The row address inputs 411a–c are typically coupled to the input pads via input buffers, an address transition detection circuit, and a row predecoder circuit (not shown).

The sub word line driver circuits 420a and 420b include the sub word line driver circuits for two memory blocks (i.e., block A and block B). The sub word line driver 420a for block A is coupled between the global word line 430 and the sub word line 440 for block A. Because the sub word line driver 420a operates as an inverter, the global word line 430 and the sub word line 440 are typically at complementary logic levels. Similarly, the sub word line driver 420b is coupled between global word line 430 and sub word line 450. Because the sub word line driver 420b operates as an inverter, the global word line 430 and the sub word line 450b are typically at complementary logic levels.

The transistors 421, 422, and 423, which together operate as an inverter, provide the sub word line driver circuit 420a for the memory block A. The source terminal of the transistor 421 is coupled to the block A select line and the gate of the transistor 423 is coupled to the block A bar select line. Furthermore, the global word line 430 is coupled to the gate terminals of the transistors 421 and 422. Thus, the sub word line coupled to the memory block A is selected by the sub word line driver comprising of the transistors 421, 422, and 423.

The transistors 424, 425, and 426, which together operate as an inverter, provide the sub word line driver circuit 420b for the memory block B. The sub word line driver circuit for the memory block B operates in a similar manner as the sub word line driver circuit for the memory block A. The block B select line is coupled to the source terminal of the transistor 424 and the block B bar select line is coupled to the gate of the transistor 426. Furthermore, the global word line 430 is coupled to the gate terminals of the transistors 424 and 425. Thus, the circuit 420 represents the sub word line drivers used to select both block A and block B.

The sub word line for the memory block A is illustrated by the metal 2 resistive capacitance ("RC") line 440a and the poly RC line 440b, which are electrically coupled. Similarly, the sub word line for the memory block B is illustrated by the metal RC line 450a and the poly RC line 450b, which are electrically coupled. The poly RC lines 440b and 450b are the actual sub word lines and the metal RC lines 440a and 450a are used as a "strap" to reduce the RC time constant of the entire sub word line 440 and 450. As previously noted, the metal line 440a and the metal line 450a may be fabricated from a metal 2 layer and the poly line 440b and 450b may be fabricated from a polysilicon layer.

Thus, decoding circuit 400 illustrates that the global word line 430 and the sub word lines 440 and 450 typically have complementary logic potentials. As previously noted, the failure mode associated with the shorting of such global and sub word lines often increases the yield loss of a particular memory device. Furthermore, decoding circuit 400 contains only two sub word line driver circuits, one for selecting a first memory block A and one for selecting a second memory block B.

One drawback of grouping only two sub word line driver circuits together is that the die layout may not allow an input/output device (e.g., a pad) to be placed directly adjacent to the sub word line driver circuits 420. FIG. 5 illustrates a block die layout of a two-memory block section of an integrated circuit including the sub word line driver circuits of FIGS. 2 and 4. FIG. 5 illustrates that there may not be sufficient space immediately adjacent to the sub word line drivers to place a pad. The sub word line driver circuits located in areas 530 and 540 correspond to the sub word line driver circuits 420a and 420b shown in FIG. 4.

Located next to memory block A is the bit-line ("BL") pull-up circuit area 550 associated with memory block A. Located next to the memory block B is the BL pull-up circuit area 560 associated with the memory block B. The layout in FIG. 5 does not provide sufficient space between areas 550, 530, 540, and 560 to place a pad between them. Therefore, the pads are placed outside the periphery of the BL pull-up circuit areas 550 and 560. On the other hand, if the pad is positioned between areas 550, 530, 540 and 560 it is likely to reduce the overall die size.

SUMMARY OF THE INVENTION

The present invention concerns an improved sub word line driver circuit used in a block selecting scheme. The sub word line driver circuit includes an inverter circuit having an input and an output. The input of the inverter circuit is configured to receive a global word line signal from a global word line. The sub word line driver circuit also includes a first block line driver circuit and a second block line driver circuit. The first and the second line driver circuits are both coupled to the output of the inverter circuit. The first block line driver circuit provides a first block sub word line signal to a first memory block over a first sub word line. The second block line driver circuit provides a second block sub word line signal to a second memory block over a second sub word line. The second sub word line passes through the first memory block without being electrically coupled to the first memory block.

The present invention also concerns a decoding circuit for an integrated circuit having a memory array arranged in memory blocks. The decoding circuit includes a row decoding circuit, a global word line, and a sub word line driver circuit. The row decoding circuit includes an even number of inversion circuits. The global word line is coupled to the row decoding circuit. The sub word line driver circuit is coupled to the global word line. The sub word line driver circuit includes a first inverter circuit and a plurality of block enable circuits. The first inverter circuit is coupled between the global word line and the plurality of block enable circuits.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 6 illustrates one embodiment of the present memory device.

DETAILED DESCRIPTION

Figure 1:
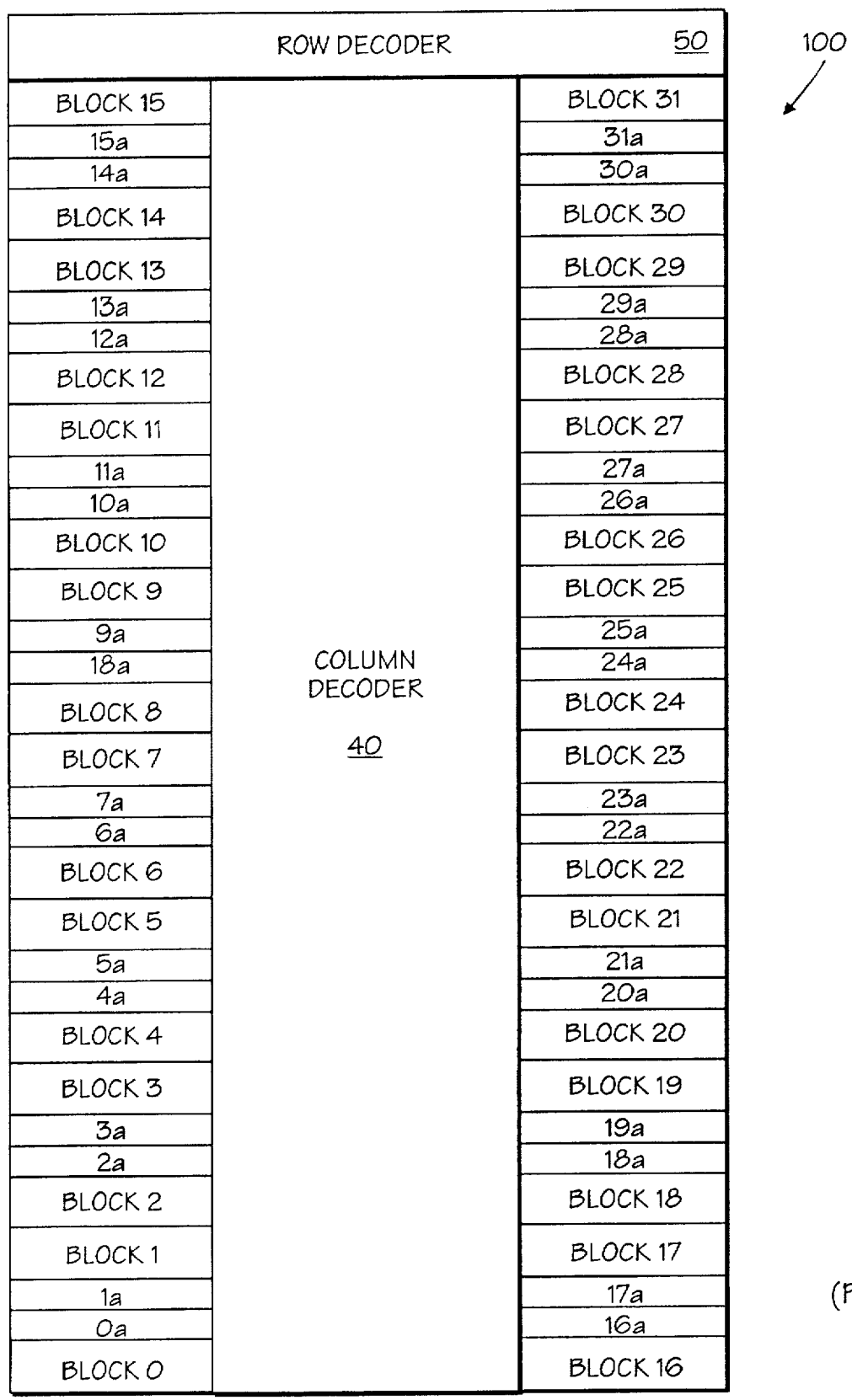
FIG. 1 illustrates a conventional memory device with its memory array divided into multiple memory blocks.
Figure 2:
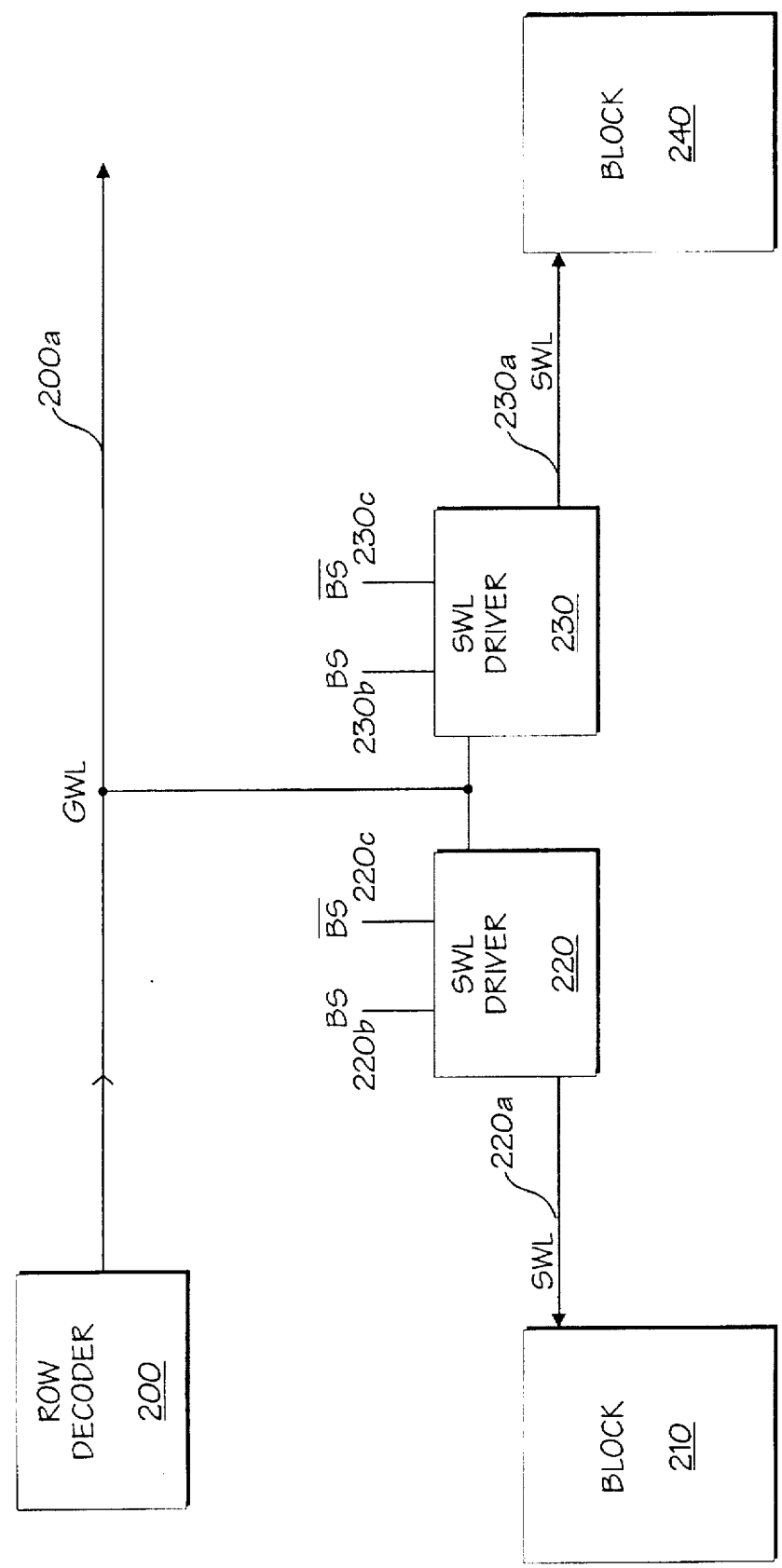
FIG. 2 illustrates in block diagram form a conventional row decoding circuit for two memory blocks.
Figure 3:
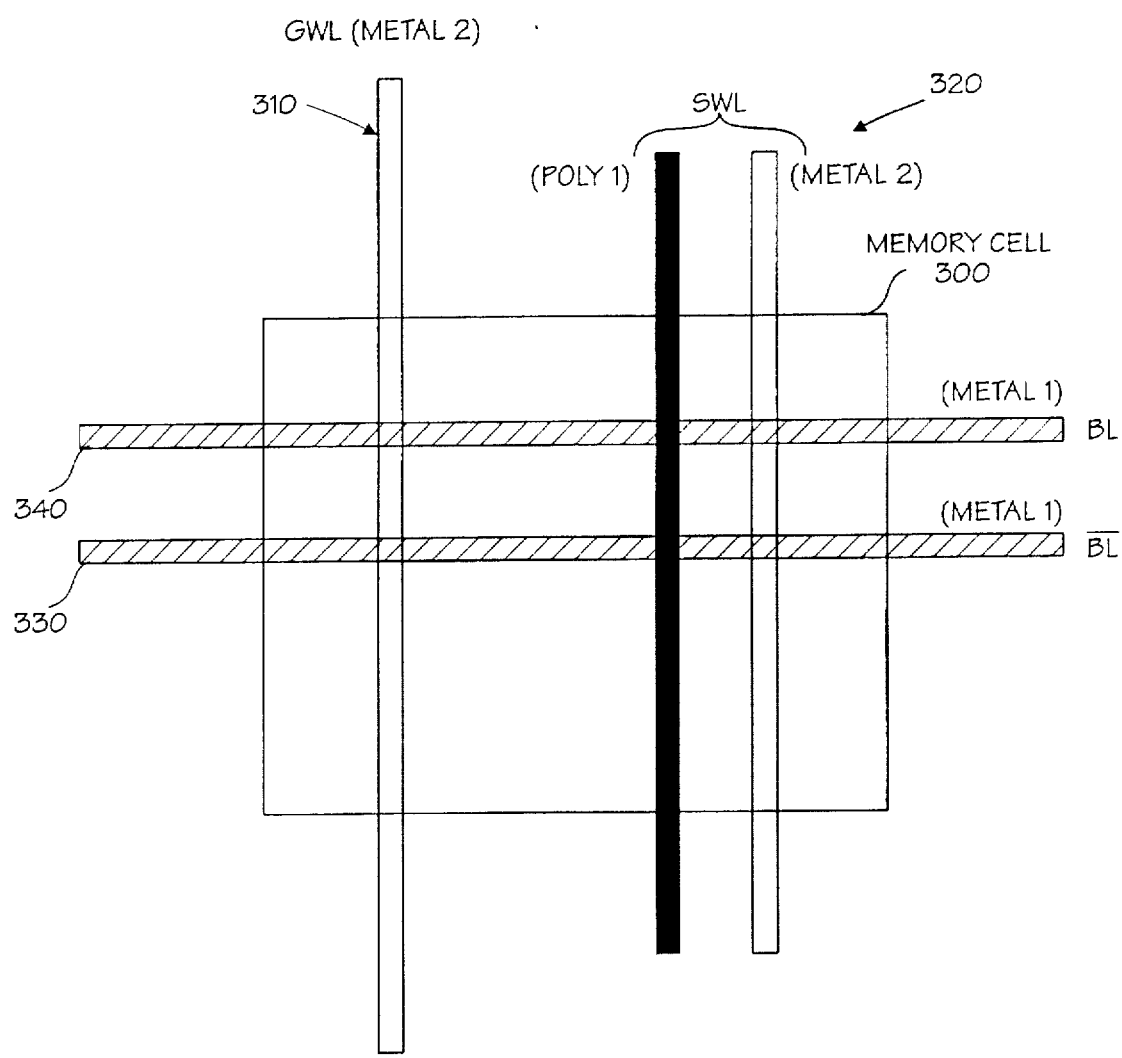
FIG. 3 illustrates a layout of a global word line and a sub word line in a memory cell.
Figure 4:
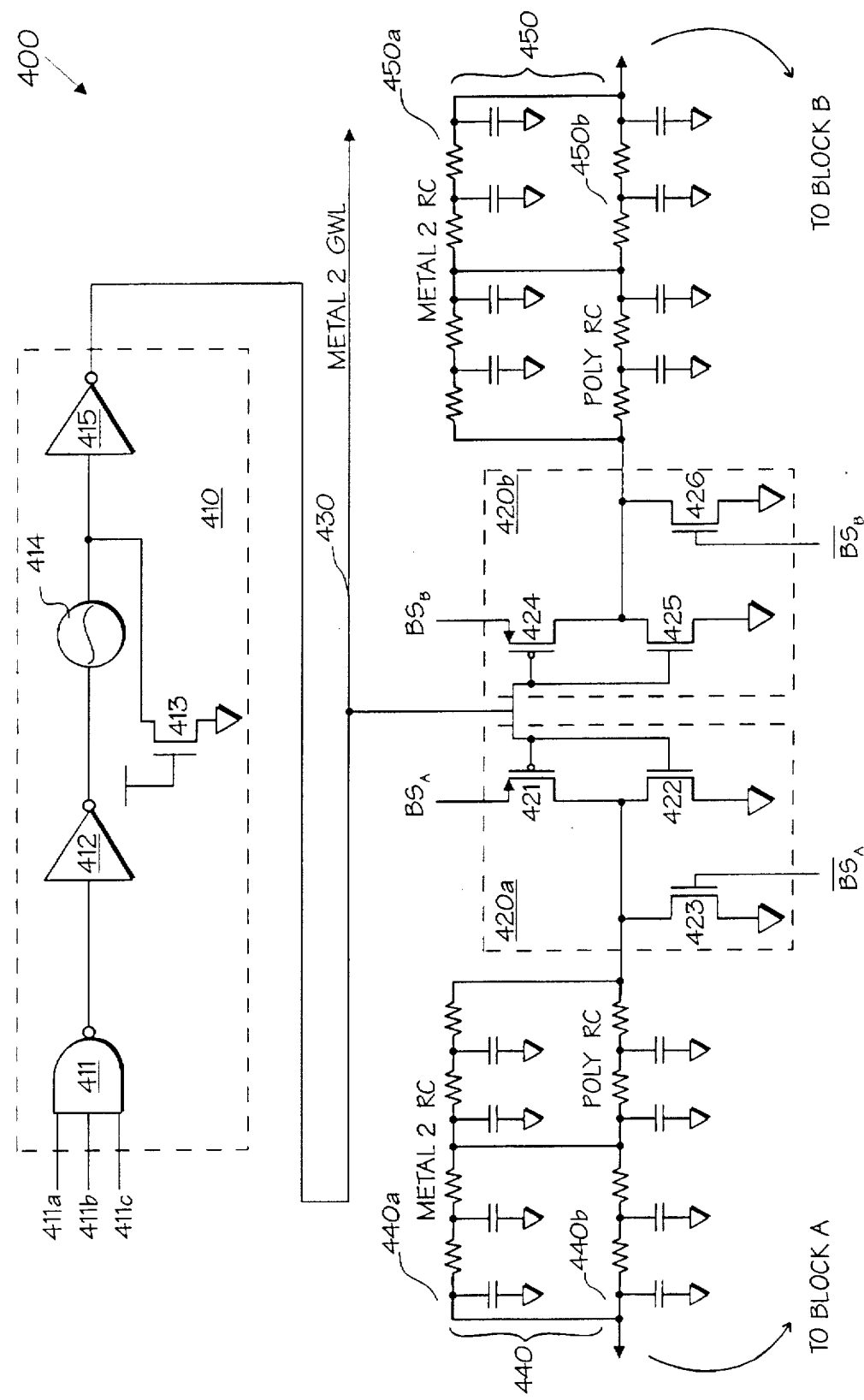
FIG. 4 illustrates a conventional row decoding circuit for two memory blocks.
Figure 5:
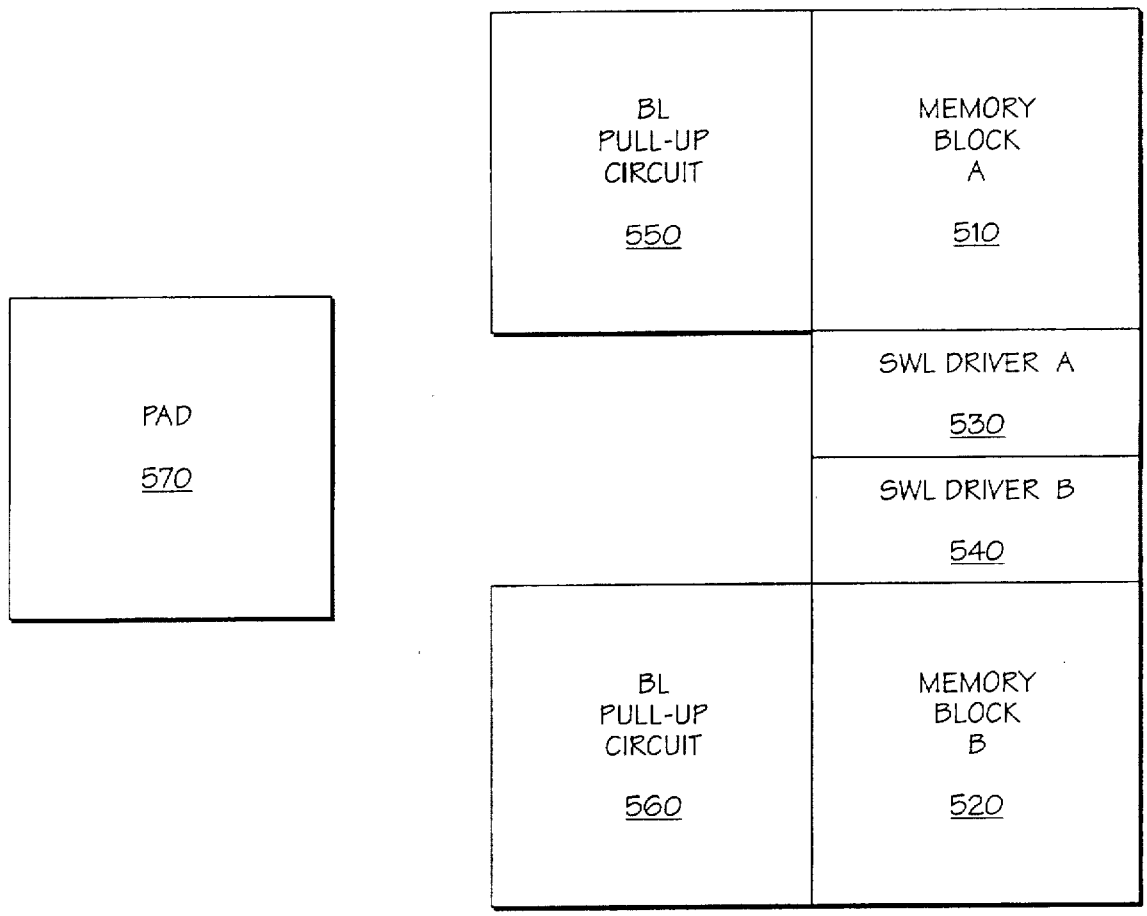
FIG. 5 illustrates a conventional layout of a two memory block section of a memory device, and the sub word line driver circuits, bit-line pull-up circuits, and pad associated therewith.

The following detailed description sets forth embodiments in accordance with the present invention for a block selecting scheme in a memory device. In the following description, details are set forth such as specific circuitry configurations in order to provide a thorough understanding of the present invention. It will be evident, however, that the present invention may be practiced other than as explicitly described in these details. In other instances, the functioning of well-known circuit components, logic gates, etc., have not been described in particular detail so as not to obscure the present invention.

The memory device 6000 shown in FIG. 6 incorporates an embodiment of the present block selecting scheme. The memory device 6000 may have its memory array divided into multiple memory blocks. The memory array shown in FIG. 6 is divided into 32 blocks 600–631 of memory cells, each block including memory cells arranged in a mini-array (e.g., 128 columns and 260 rows). However, the memory array may contain any number of blocks, and the blocks may contain any number of columns and rows that can be configured in a manufacturable architecture. For example, the memory array preferably contains at least four, more preferably at least eight, memory blocks. Furthermore, the blocks may independently contain at least two, preferably at least $2^n$ (where $n \geq 2$) columns and at least $2^m$ (where $m \geq 2$, preferable $\geq 5$) rows. By incorporating the present block addressing scheme into the memory device 600, the memory blocks 600–631 and their respective sub word line driver circuits 600a–631a may be grouped in a manner similar to that shown in FIG. 6.

According to FIG. 6, four of the sub word line driver circuits are grouped together. For example, the sub word line driver circuits 600a–603a are grouped together; the sub word line driver circuits 604a–607a are grouped together; the sub word line driver circuits 608a–611a are grouped together; the sub word line driver circuits 612a–615a are grouped together; etc. By grouping four sub word line driver circuits together, the memory blocks corresponding to the four sub word line driver circuits in a particular grouping are also grouped together. For example, the memory blocks 600–603 are grouped with the sub word line driver circuits 600a–603a. By grouping four sub word line driver circuits together, rather than two sub word line drivers circuits, the memory device 6000 may reduce the die size relative to memory device 100. Although FIG. 6 illustrates that four sub word line drivers are grouped together, the present embodiment is not limited to a grouping of four sub word line drivers. For example, any number from 2x−1 to 2x+1 (where x≥2) sub word lines may be grouped together, but preferably, 2x sub word lines are grouped together.

Column addresses may be applied to the column decoder 640 of the memory device 6000 to generate column select signals. The row addresses may be applied to the row decoder 650 to select the desired row lines, often referred to as the global word lines. Typically, a global word line runs the entire length of the memory device 6000. For example, the global word lines may run from the row decoder 650 through blocks 615–600, or from the row decoder 650 through blocks 631–616.

Figure 7:
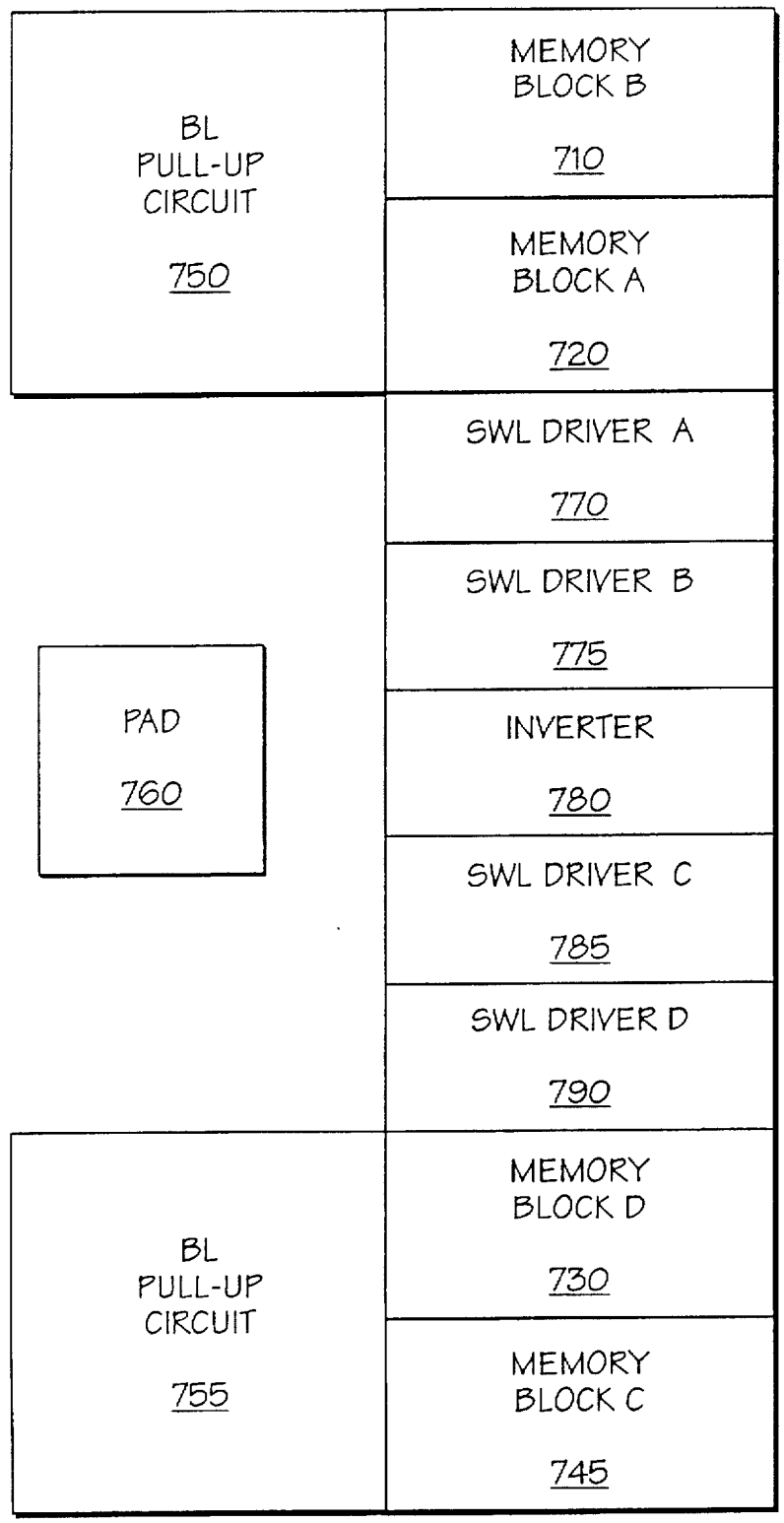
FIG. 7 shows one embodiment of the present invention illustrating a layout of four memory blocks and their associated sub word line driver circuits, bit-line pull-up circuits, and a pad.

FIG. 7 illustrates one embodiment of the layout of four memory blocks along with their associated sub word line driver circuits, bit-line pull-up circuits, and a pad. According to FIG. 7, the memory block A may be positioned within the area 720, the memory block B may be positioned within the area 710, the memory block D may be positioned within the area 730, and the memory block C may be positioned within the area 745. The sub word line driver circuits corresponding to the four memory blocks A–D, may be located in the areas 770, 775, 785, and 790, respectively. The bit-line pull up circuits for the memory blocks A and B may be positioned within the area 750 and the bit-line pull up circuits for the memory blocks C and D may be positioned within the area 755.

The memory blocks A and D may be referred to as the "near" memory blocks because they are the memory blocks located near (and preferably directly adjacent) to sub word line driver circuits 770, 775, 785, and 790, relative to memory blocks B and C. Furthermore, the memory blocks B and C may be referred to as the "far" memory blocks because they are located farther from sub word line driver circuits 770, 775, 785, and 790 than memory blocks A and D. In a preferred embodiment, its "near" memory block is located between the "far" memory block and the corresponding sub word line driver circuit. Thus, the sub word lines used for selecting the far memory blocks may pass through a near memory block and the sub word lines used for selecting the near memory blocks may be directly connected to the near memory blocks. This particular embodiment of four sub word line driver circuits may be further coupled to an inverter 780.

Figure 8:
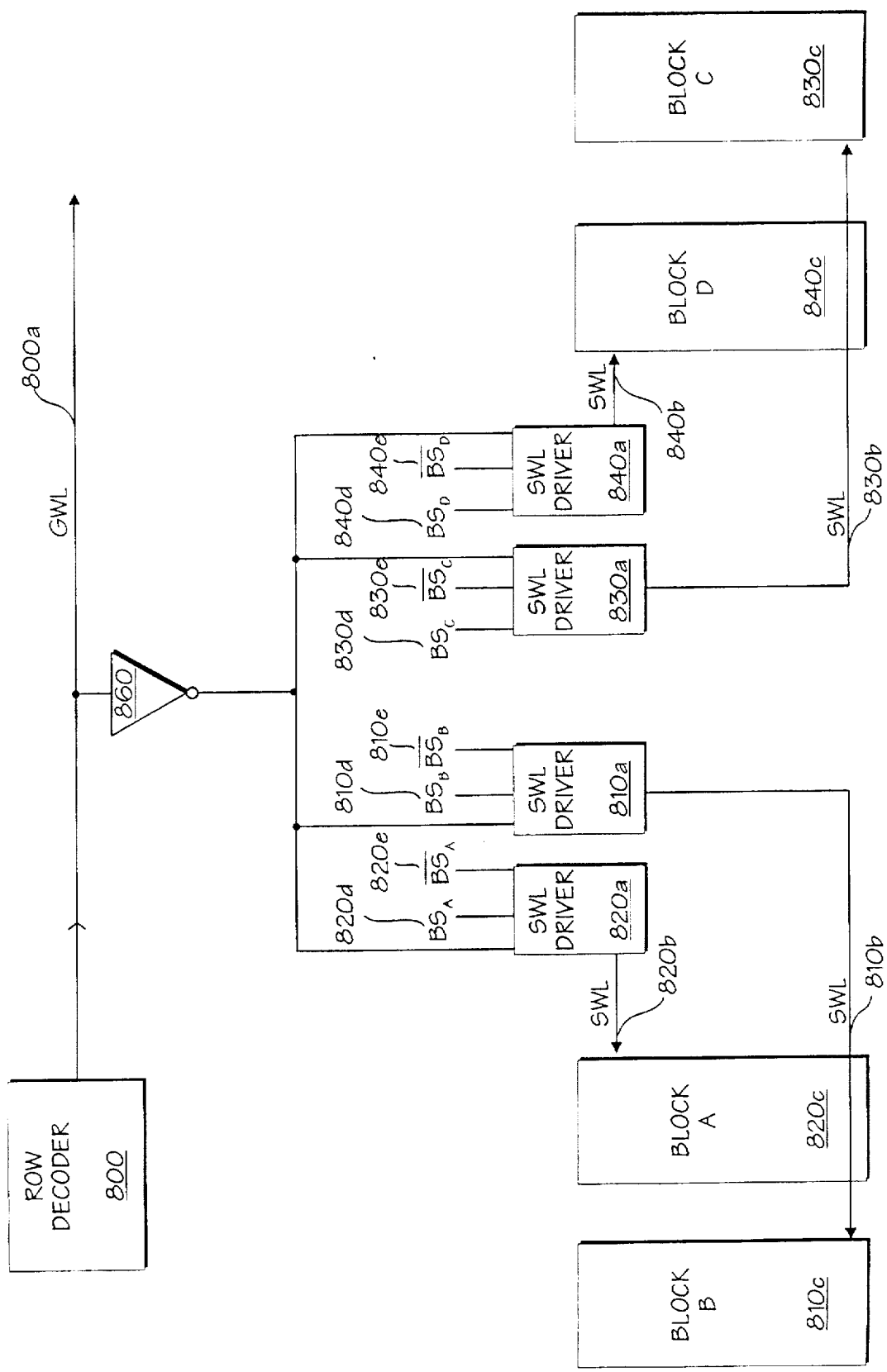
FIG. 8 illustrates in block diagram form, an embodiment of the present row decoding circuit for four memory blocks.

By grouping four sub word line driver circuits together in the memory shown in FIGS. 7 and 8, the area adjacent to the sub word line driver circuits and between the bit-line pull-up circuits 750 and 755 may accommodate an input/output device (e.g., a pad 760). For one embodiment, the pad may be approximately 120 µm. Positioning the pad 760 in this manner typically reduces the overall die size of a particular memory device because the pad may be located between bit-line pull-up circuits as shown in FIG. 7.

The global word lines and the individual block select lines may be used by the sub word line driver circuits to select the individual memory blocks via the sub word lines, as shown in FIG. 8. FIG. 8 illustrates in block diagram form a global word line 800a coupled to four sub word line driver circuits 810a, 820a, 830a, and 840a, which may respectively select the sub word lines 810b, 820b, 830b, and 840b. The sub word line 820b may select the memory cells in memory block 820c and the sub word line 840b may select the memory cells in memory block 840c.

The memory blocks 820c and 840c may be considered "near" memory blocks. Therefore, sub word line 820b directly couples sub word line driver 820a to memory block 820c, and sub word line 840b directly couples sub word line driver 840a to memory block 840c. Sub word line 810b may select the memory block 810c and the sub word line 830b may select the memory block 830c.

The memory blocks 810c and 830c may be considered "far" memory blocks. Therefore, the sub word line 810b may pass through the memory block 820c, and the sub word line 830b may pass through the memory block 840c. Although the sub word lines 810b and 830b may pass through the memory blocks 820c and 840c, respectively, there are no electrical connections between sub word line 810b and elements of memory block 820c, nor are there electrical connections between sub word line 830b and elements of memory block 840c.

Thus, the sub word line driver circuit 820a selects the sub word line 820b when the block A select line 820d, the block A bar select line 820e, and the global word line 800a are selected. Similarly, the sub word line driver circuit 810a selects the sub word line 810b when the block B select line 810d, the block B bar select line 810e, and the global word line 800a are selected. The sub word line driver circuits 830a and 840a operate in a similar fashion to the sub word line driver circuits 820a and 810a. Alternatively, the block bar select lines need not be selected in architectures and/or embodiments that do not input the complement of the block select lines the sub word line driver circuits. For one embodiment, the sub word lines 810b, 820b, 830b, and 840b and the global word line 800a, are active high lines and therefore, one sub word line is selected when a voltage corresponding to a high level logic (or digital "1") is applied to the global word line.

As previously noted, the present embodiment may group four sub word line driver circuits together. This grouping allows the memory device to be laid out in a manner that may decrease the overall die size of the memory device. More specifically, a pad (e.g., input pad and/or output pad) may be positioned in the space between the sub word line drivers and the bit-line pull up circuits as shown in FIG. 7.

Another advantage of the present invention, as shown in FIG. 8, is that the global word line 800a and the sub word lines 810b, 820b, 830b, and 840b may be asserted at a first voltage potential and similarly deasserted at a second voltage potential. For one embodiment, the global word line 800a and the sub word lines 810b, 820b, 830b, and 840b are all asserted at a logic high voltage level and all deasserted at a logic low voltage level.

Figure 9:
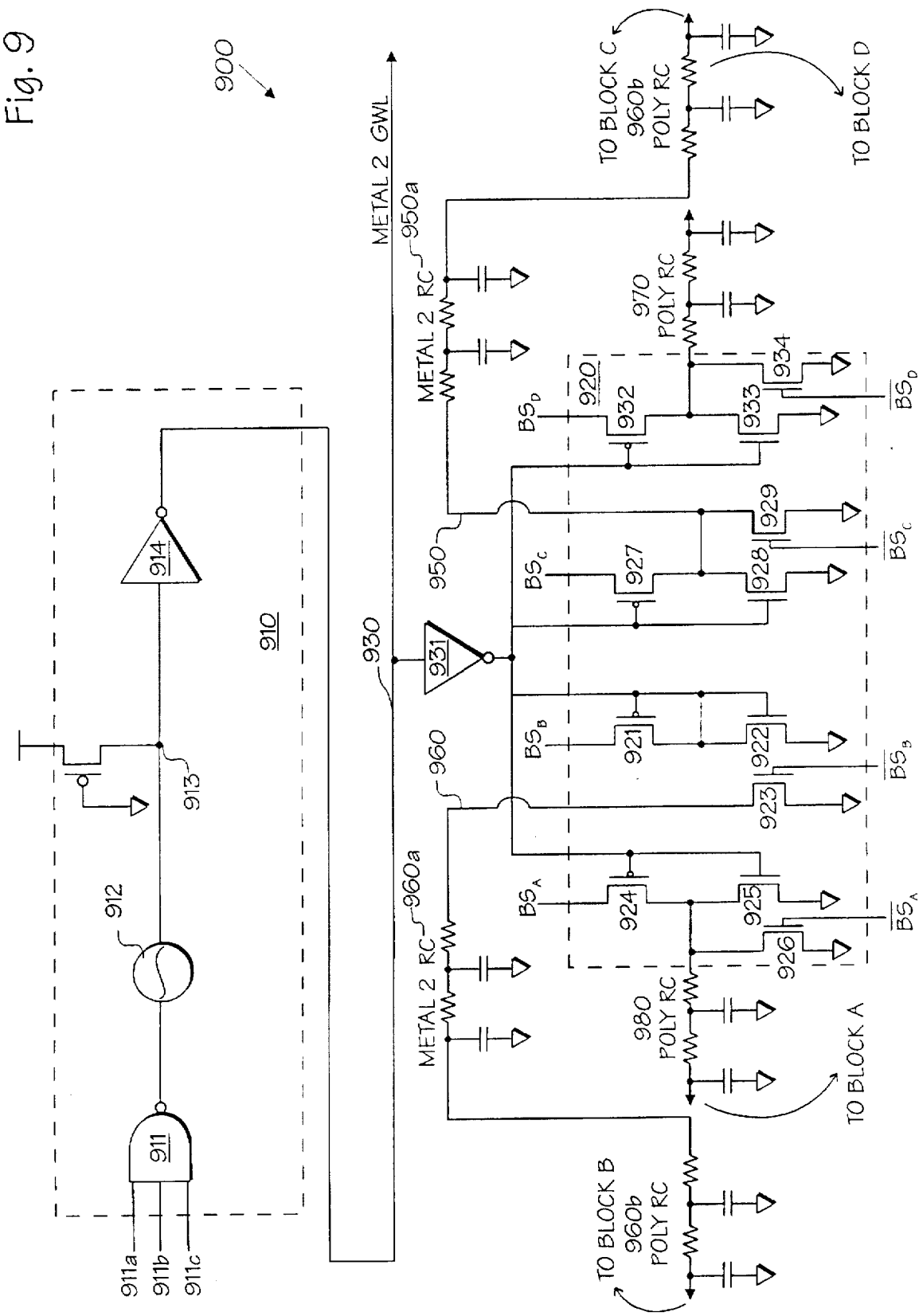
FIG. 9 illustrates an embodiment of the present row decoding circuit for four memory blocks.

FIG. 9 illustrates one embodiment of the block selecting circuitry for four memory blocks. According to FIG. 9, the box 910 represents the row decoder for the global word line 930 and the box 920 represents the sub word line driver circuits for the four sub word lines 980, 960, 950, and 970. The four sub word lines 980, 960, 950, and 970 may select or deselect memory blocks A, B, C, and D. The row decoder 910 may select or deselect the global word line 930. The row decoder 910 may include two inversion circuits—the NAND gate 911 and the inverter 914. The row decoder 910 may also include a fuse device 912 and a p-channel MOS transistor 913. The fuse device 912 may be blown or disconnected to decouple the corresponding row of memory in cells the memory array. This typically occurs when a row of memory cells is considered defective or bad and is replaced with a redundant row of memory cells (e.g., fuse replaced). The row address inputs 911a, 911b, and 911c receive input row address signals. The row address inputs 911a–c may be coupled to the input pad via input buffers (e.g., in an address transition detection circuit) and, optionally, a row predecoder (not shown), which may couple the input buffers to the row address inputs.

The sub word line driver 920 may include four sub word line driver circuits. Each sub word line driver circuit operates as an inverter circuit, and may be enabled by one or a pair of block select lines. Each sub word line circuit may be referred to as an enable inverter circuit when it is enabled by a corresponding pair of block select lines. However, one may alternatively exclude the block select complement signal ($\overline{BS}$) and corresponding transistors 926, 923, 929 and 934, and select a particular memory block by activating a single block select line. Furthermore, within the scope of the present invention, the sub word line driver may comprise any conventional word line driver circuit, and may be implemented using conventional technology and logic.

The transistors 924, 925, and 926 may represent the word line driver circuit for the memory block A; the transistors 921, 922, and 923 may represent the sub word line driver circuit for the memory block B; the transistors 927, 928, and 929 may represent the sub word line driver circuit for the memory block C; and the transistors 932, 933, and 934 may represent the sub word line driver circuit for the memory block D. For one embodiment, the transistors 924, 921, 927, and 932 may all be p-channel MOS transistors and the transistors 926, 925, 923, 922, 928, 929, 933, and 934 may all be n-channel MOS transistors.

The block A select signal BSA, the block A bar select signal $\overline{BS_A}$, and the inverted global word signal may select or deselect the sub word line 980. The block B select signal BSB, the block B bar select signal $\overline{BS_B}$, and the inverted global word line signal may select the sub word line 960. The sub word line 960 may include a metal line 960a which may be electrically coupled to a silicon containing line 960b.

The block C select line $BS_C$, the block C bar select line $\overline{BS_C}$, and the inverted global word line signal may select the sub word line 950. The sub word line 950 may include a metal line 950a electrically coupled to a polysilicon line 950b. The block D select signal $BS_D$, the block D bar select signal $\overline{BS_D}$, and the inverted global word line signal may select the sub word line 970. The logic level of the global word line signal may be inverted by the inverter 931.

The sub word line 980 and the sub word line 970 may both be fabricated from a silicon containing layer and may be directly coupled to the memory block A and the memory block D, respectively. Silicon-containing lines may comprise a polysilicon, a silicide (e.g., titanium silicide, tungsten silicide, cobalt silicide, aluminum silicide, chromium silicide, copper silicide, etc.), a conventional silicide, or any combination thereof. Furthermore, the sub word line 960 and the sub word line 950 may be both fabricated with a metal layer, that may be interconnected with a silicon-containing layer. The metals in the metal layer comprise many electrically conductive materials, but preferably comprises a metal or metal alloy. Also, the global word line 930 may be fabricated with a metal layer, preferably the same metal layer as the sub word line(s).

Because the path from the global word line 930 to each of the sub word lines 960, 980, 950, and 970 may include two inverting circuits, the global word line 930 and the sub word lines 960, 980, 950, and 970 may be selected at a first voltage level (e.g., a voltage corresponding to a logic high level) and deselected at a second voltage level (e.g., a voltage corresponding to a logic low level). For one embodiment, the global word line and sub word lines are all active high lines.

Thus, if each of global word line 930 and sub word line 980 is at a logic high voltage level, then memory block A is selected when enabled by the block select signals (e.g., $BS_A$ and $\overline{BS_A}$). When memory block A is selected, the memory cells located within the block A may be accessed for various operations (e.g., reading, writing, programming, erasing, etc.), provided memory block A is also selected by the column decoder. The memory cells in memory blocks B, C, and D are also accessed in a similar manner.

On the other hand, the global word line 930 and the sub word lines 960, 980, 950, and 970 may also be deselected or deactivated at a second logic voltage level. For one embodiment, the global word line 930 and the sub word lines 960, 980, 950, and 970 are deselected by a logic low voltage level. One advantage of having adjacent global word lines and sub word lines deselected at the same voltage potential is that shorting between the adjacent lines may not have a deleterious effect. For example, even when inadvertently electrically coupled (e.g., by a fabrication error) when both word lines are deasserted at a ground voltage level, little or no current is consumed. Shorting that occurs in memory cells having adjacent global word lines and sub word lines that are deasserted at different voltage potentials wastefully consumes current and can lead to device failures. Moreover, wasteful current consumption may become more apparent in memory devices having adjacent word lines deactivated at different voltage levels that are capable of operating in a low power or standby mode when substantially all of the word lines are deselected.

The shorting of the global word line and sub word lines may cause the memory device to generate more standby current than specified in the manufacturer's specification for that particular memory device. As a result, the increased standby current may cause the memory device to fail standard production/manufacturing tests and thereby reduce the production yield of a particular memory product.

The present embodiment alleviates the effect of this type of current loss by providing a block selecting scheme that allows the global word lines and sub word lines to be deactivated at the same voltage potential. Circuit 900 illustrates that the path between the global word line 930 and any one of the sub word lines 960, 980, 970, and 950 includes two logic inversion circuits. In other words, the global word line signal is inverted by the inverter 931 and then inverted again by one of the sub word line driver circuits. Each of the sub word line driver circuits operates as an inverter when enabled by its corresponding block select signal. For example, when the global word line 930 is deselected with a low logic voltage level and the block B select signal $BS_B$ and the block B select bar signal $\overline{BS_B}$ are enabled, then the gate terminals of the transistors 921 and 922 receive a high voltage signal. The sub word line driver circuit then outputs a low voltage signal at the drain terminal of the transistor 922. This low voltage signal deselects the sub word line 960. Thus, the global word line 930 and the sub word line 960 may be held at a low logic voltage level when deselected.

Figure 10:
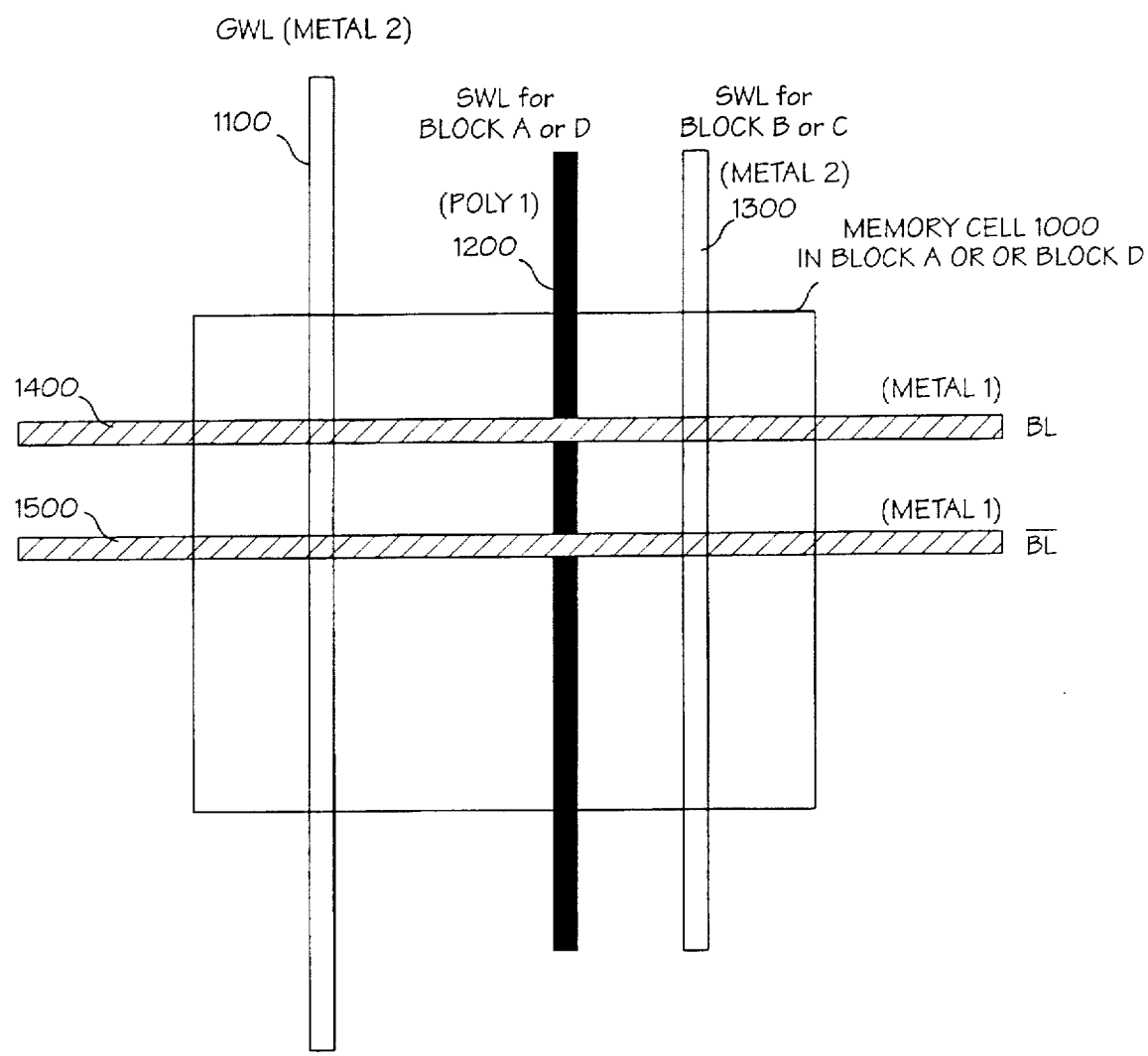
FIG. 10 illustrates one embodiment of the present layout of a global word line and two sub word lines in a memory cell located in a near memory block.

FIG. 10 illustrates the layout of a memory cell 1000 located within a near memory block (i.e., block A or D of FIGS. 7 and 8). In other words, the memory cell 1000 represents a memory cell in a memory block located between the corresponding sub word line driver circuit and a "far" memory block (preferably immediately adjacent to its corresponding sub word line driver), as opposed to a memory block separated from its corresponding sub word line driver by another memory block.

The global word line 1100 may be fabricated from a metal layer, referred to in FIG. 10 as "metal 2". The sub word line 1200 for block A or block D may be directly connected to its corresponding sub word line driver and may be fabricated from a silicon-containing layer, referred to in FIG. 10 as "poly 1". Adjacent to the sub word line 1200 is the sub word line 1300 which represents the sub word line for block B or C. Thus, for the embodiment of FIG. 10, the sub word line 1300 for the memory cells within a "far" memory block may pass through some or all of the memory cells in the near memory block. Alternatively, sub word line 1300 may pass between cells of the "near" memory block, or be routed entirely around the near memory block (e.g., for cells in a terminal row of the block). However, such alternative architectures may not be performed due to a potential increase in overall chip/circuit size. Global word line 1100 and sub word line 1300 typically do not short and/or result in unnecessary leakage current when sub word line 1300 and global word line 1100 are at approximately the same voltage level.

Figure 11:
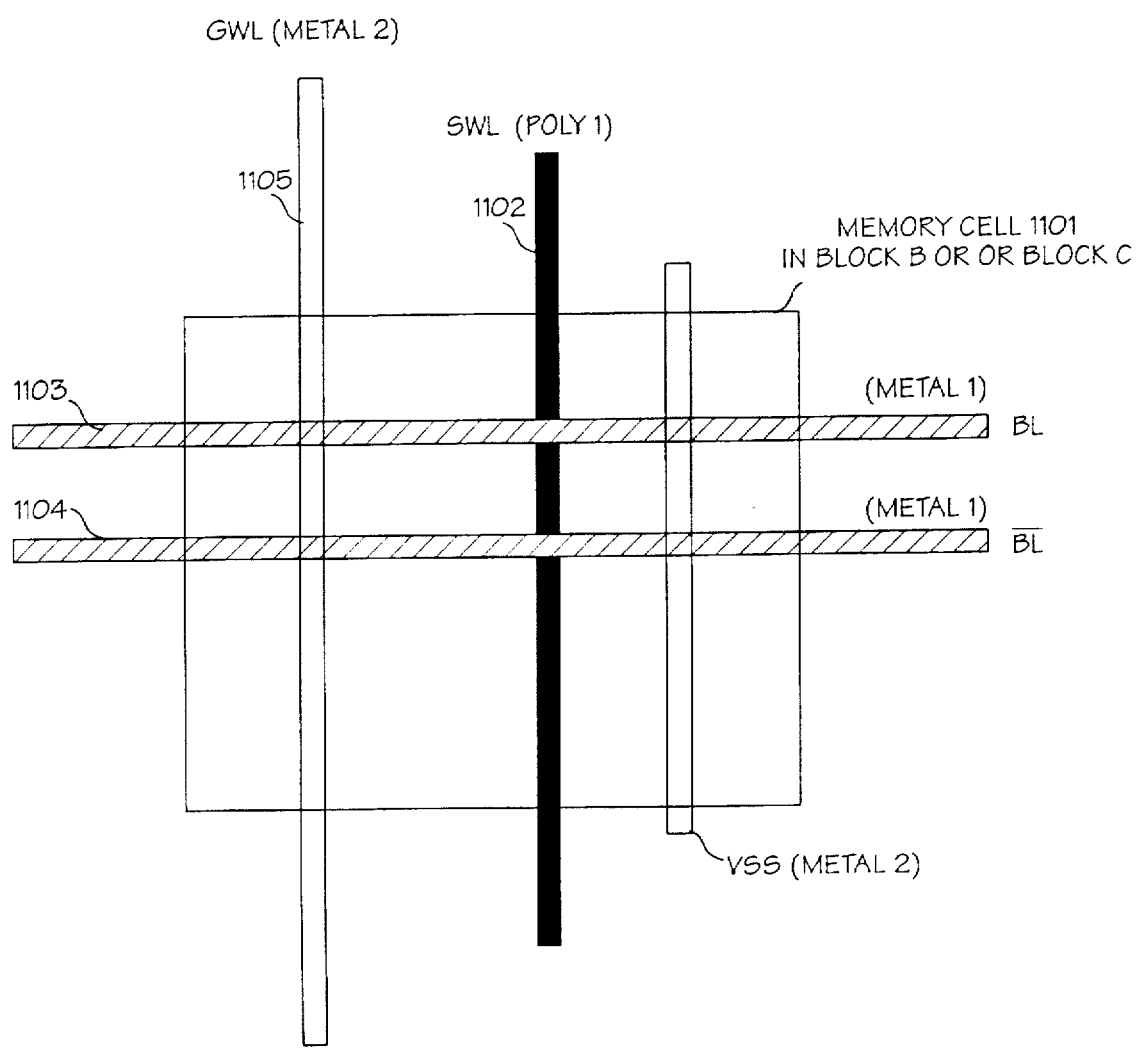
FIG. 11 illustrates one embodiment of the present layout of a global word line and sub word line in a memory cell located in a far memory block.

FIG. 11 illustrates a memory cell 1101 in a "far" memory block, such as memory blocks B or C of FIGS. 7 and 8. The global word line 1105 may be fabricated from a metal layer (preferably the same metal layer and the same line as the corresponding "near" memory block) and the sub word line 1102 may be fabricated with poly 1. The bit-line and the bit-line bar lines 1103 and 1104 may be fabricated from a metal layer (referred to in FIG. 11 as "metal 1"). The bit lines 1103 and 1104 may be made from the same metal layer as the bit lines 1400 and 1500 shown in FIG. 10, assuming memory cells 1000 and 1101 are adjacent to each other. Preferably, the bit lines comprise a different metal layer from the word lines, but it is possible to implement an architecture where bitlines and word lines are formed from the same metal or silicon-containing layer (see co-pending U.S. application filed on Nov. 21, 1996, as Attorney Docket Number 16820.P171) and assigned U.S. Ser. No. 08/754,521. The shorting of two metal lines (i.e., the global word line and the ground line) may not cause unnecessary and/or undesired current loss when the global word line 1101 and the sub word line 1102 are at approximately the same voltage level.

Thus, the present block selecting scheme substantially eliminates the effect of this type of shorting. As a result, the yield loss of a particular memory device may be reduced. Furthermore, by grouping four sub word line driver circuits together, the overall lay out area for each memory device is decreased. Thus, each memory device may be fabricated with a smaller die size.

For alternative embodiments, the sub word lines 1102 and 1200 may comprise a metal and the sub word line 1300 may comprise a silicon-containing material. Furthermore, all word lines may be either a metal, a silicon-containing material, or a combination thereof. All word lines may also be fabricated from the same layer, although there may be an increase. In cell/chip size, it may be preferred to use a silicon-containing material for "near" memory block sub word lines and a metal for "far" memory block sub word lines, due to the generally higher resistance of silicon-containing materials.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive manner.

What is claimed is:

1. A decoding circuit for an integrated circuit having a memory array arranged in memory blocks, comprising;

a row decoding circuit including an even number of inversion circuits;

a global word line coupled to s aid row decoding circuit;

a sub word line driver circuit coupled to said global word line, said sub word line driver circuit includes an inverter circuit and a plurality of block line driver circuits, said inverter circuit is coupled between said global word line and said plurality of block line driver circuits;

a plurality of sub word lines, wherein each of said sub word lines is coupled to a corresponding block line driver circuit; and a first memory block, a second memory block, a third memory block, and a fourth memory block, said first memory block is located between said sub word line driver circuit and said second memory block, and said third memory block is located between said sub word line driver circuit and said fourth memory block.

2. The decoding circuit of claim 1, wherein said sub word line driver circuit further comprises:

a first block line driver circuit coupled to the output of said inverter circuit, wherein said first block line driver circuit is configured to provide a first block sub word line signal to the first memory block via a first sub word line; and a second block line driver circuit coupled to said output of said inverter circuit, wherein said second block line driver circuit is configured to provide a second block sub word line signal to the second memory block via a second sub word line, and said second sub word line extends through said first memory block without being electrically coupled to said first memory block.

3. The decoding circuit of claim 2, wherein said global word line is asserted at a first logic state, said first block sub word line signal is asserted at said first logic state, said second block sub word line signal is asserted at said first logic state, said global word line is deasserted at a second logic state, said first block sub word line is deasserted at said second logic state, and said second block sub word line signal is deasserted at said second logic state.

4. The decoding circuit of claim 3, wherein said first logic state represents a logic high voltage level and said second logic state represents a logic low voltage level.

5. The decoding circuit of claim 3, wherein said global word line, said first block sub word line signal, and said second block sub word line signal are all deasserted during a standby mode of operation of said sub word line driver circuit.

6. The decoding circuit of claim 2, wherein said first block line driver circuit includes an input and an output, said input is coupled to said output of said inverter circuit, said output is coupled to said first sub word line, said first block line driver circuit further includes a first MOS transistor, a second MOS transistor, and a third MOS transistor, said first MOS transistor having a first input coupled to said input of said first block line driver circuit, a second input coupled to a first select line, and a third input coupled to said output of said first block line driver circuit, said second MOS transistor having a first input coupled to said input of said first block line driver circuit, a second input coupled to said output of said first block line driver circuit, and a third input coupled to a voltage conduit, said third MOS transistor having a first input coupled to a second select line, a second input coupled to said output of said first block line driver circuit, and a third input coupled to said voltage conduit;

said second block line driver circuit includes an input and an output, said input is coupled to said output of said inverter circuit, said output is coupled to said second sub word line, said second block line driver circuit further includes a fourth MOS transistor, a fifth MOS transistor, and a sixth MOS transistor, said fourth MOS transistor having a first input coupled to said input of said second block line driver circuit, a second input coupled to a third select line, and a third input coupled to said output of said second block line driver circuit, said fifth MOS transistor having a first input coupled to said input of said second block line driver circuit, a second input coupled to said output of said second block line driver circuit, and a third input coupled to said voltage conduit, said sixth MOS transistor having a first input coupled to a fourth select line, a second input coupled to said output of said second block line driver circuit, and a third input coupled to said voltage conduit.

7. The decoding circuit of claim 2, further comprising:

a third block line driver circuit coupled to said output of said inverter circuit, wherein said third block line driver circuit is configured to provide a third block sub word line signal to the third memory block via a third sub word line; and a fourth block line driver circuit coupled to said output of said inverter circuit, wherein said fourth block line driver circuit is configured to provide a fourth block sub word line signal to the fourth memory block via a fourth sub word line, said fourth sub word line extends through said third memory block without being electrically coupled to said third memory block.

8. The decoding circuit of claim 7, wherein said global word line is asserted at a first logic state, said first block sub word line signal is asserted at said first logic state, said second block sub word line signal is asserted at said first logic state, said third block sub word line signal is asserted at said first logic state, said fourth block sub word line signal is asserted at said first logic state, said global word line is deasserted at a second logic state, said first block sub word line signal is deasserted at said second logic state, said second block sub word line signal is deasserted at said second logic state, said third block sub word line signal is deasserted at said second logic state, and said fourth block sub word line signal is deasserted at said second logic state.

9. The decoding circuit of claim 8, wherein said first logic state represents a logic high voltage level and said second logic state represents a logic low voltage level.

10. The decoding circuit of claim 7, wherein said first block line driver circuit includes an input and an output, said input is coupled to said output of said inverter circuit, said output is coupled to said first sub word line, said first block line driver circuit further includes a first MOS transistor, a second MOS transistor, and a third MOS transistor, said first MOS transistor having a first input coupled to said input of said first block line driver circuit, a second input coupled to a first select line, and a third input coupled to said output of said first block line driver circuit, said second MOS transistor having a first input coupled to said input of said first block line driver circuit, a second input coupled to said output of said first block line driver circuit, and a third input coupled to a voltage conduit, said third MOS transistor having a first input coupled to a second select line, a second input coupled to said output of said first block line driver circuit, and a third input coupled to said voltage conduit;

said second block line driver circuit includes an input and an output, said input is coupled to said output of said inverter circuit, said output is coupled to said second sub word line, said second block line driver circuit further includes a fourth MOS transistor, a fifth MOS transistor, and a sixth MOS transistor, said fourth MOS transistor having a first input coupled to said input of said second block line driver circuit, a second input coupled to a third select line, and a third input coupled to said output of said second block line driver circuit, said fifth MOS transistor having a first input coupled to said input of said second block line driver circuit, a second input coupled to said output of said second block line driver circuit, and a third input coupled to said voltage conduit, said sixth MOS transistor having a first input coupled to a fourth select line, a second input coupled to said output of said second block line driver circuit, and a third input coupled to said voltage conduit;

said third block line driver circuit includes an input and an output, said input is coupled to said output of said inverter circuit, said output is coupled to said third sub word line, said third block line driver circuit further includes a seventh MOS transistor, an eighth MOS transistor, and a ninth MOS transistor, said seventh MOS transistor having a first input coupled to said input of said third block line driver circuit, a second input coupled to a fifth select line, and a third input coupled to said output of said third block line driver circuit, said eighth MOS transistor having a first input coupled to said input of said third block line driver circuit, a second input coupled to said output of said third block line driver circuit, and a third input coupled to said voltage conduit, said ninth MOS transistor having a first input coupled to a sixth select line, a second input coupled to said output of said third block line driver circuit, and a third input coupled to said voltage conduit;

said fourth block line driver circuit includes an input and an output, said input is coupled to said output of said inverter circuit, said output is coupled to said fourth sub word line, said fourth block line driver circuit further includes a tenth MOS transistor, an eleventh MOS transistor, and a twelfth MOS transistor, said tenth MOS transistor having a first input coupled to said input of said fourth block line driver circuit, a second input coupled to a seventh select line, and a third input coupled to said output of said fourth block line driver circuit, said eleventh MOS transistor having a first input coupled to said input of said fourth block line driver circuit, a second input coupled to said output of said fourth block line driver circuit, and a third input coupled to said voltage conduit, said twelfth MOS transistor having a first input coupled to an eighth select line, a second input coupled to said output of said fourth block line driver circuit, and a third input coupled to said voltage conduit.

11. The decoding circuit of claim 10, wherein said first transistor, said fourth transistor, said seventh transistor, and said tenth transistor are p-channel MOS transistors, and wherein said second transistor, said third transistor, said fifth transistor, said sixth transistor, said eighth transistor, said ninth transistor, said eleventh transistor, and said twelfth transistor are n-channel MOS transistors.

12. The decoding circuit of claim 10, wherein said first and second select lines are complementary, said third and fourth select lines are complementary, said fifth and sixth select lines are complementary, and said seventh and eighth select lines are complementary.

13. The decoding circuit of claim 10, wherein said voltage conduit is at ground voltage.

14. The decoding circuit of claim 7, wherein said global word line comprises a first metal line, said first sub word line comprises a first silicon-containing line, said second sub word line comprises a second metal line coupled to a second silicon-containing line, said third sub word line comprises a third silicon-containing line, and said fourth sub word line comprises a third metal line coupled to a fourth silicon-containing line.

15. The decoding circuit of claim 14, wherein said first, second, and said third metal lines are fabricated from one layer of metal, and said first, second, third, and fourth silicon-containing lines are fabricated from one layer of a silicon-containing material.

16. The decoding circuit of claim 1, wherein said global word line and each of said sub word lines are activated by a voltage signal having a first logic state and deactivated by a voltage signal having a second logic state.

17. The decoding circuit of claim 1, wherein said plurality of block line driver circuits includes a first block line driver circuit, a second block line driver circuit, a third block line driver circuit, and a fourth block line driver circuit.

18. The decoding circuit of claim 1 further comprising a pad, and a first bit-line pull-up circuit, wherein said pad is positioned adjacent to said first bit-line pull-up circuit and said sub word line driver circuit.

19. The decoding circuit of claim 18, wherein said pad does not extend into said first bit-line pull-up circuit.

* * * * *